(12) United States Patent
Ota et al.

(10) Patent No.: US 6,336,054 B1
(45) Date of Patent: Jan. 1, 2002

(54) INTERLOCK APPARATUS FOR A TRANSFER MACHINE

(75) Inventors: Yoshiharu Ota; Masaaki Yoshida, both of Kumamoto-ken; Shinya Tanoue; Tatsuya Iwasaki, both of Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/291,045

(22) Filed: Apr. 14, 1999

Related U.S. Application Data

(62) Division of application No. 08/904,848, filed on Aug. 1, 1997, now Pat. No. 5,963,449.

(30) Foreign Application Priority Data

Aug. 8, 1996 (JP) .............................................. 8-227513

(51) Int. Cl.$^7$ .............................................. G06F 19/00
(52) U.S. Cl. ........................ 700/112; 700/121; 700/33; 700/75
(58) Field of Search ............................. 700/33, 34, 40, 700/56, 79, 57, 88, 112, 121, 250, 255–257, 264, 69, 70; 318/568.11, 568.13, 568.14; 438/694

(56) References Cited

U.S. PATENT DOCUMENTS

| | | | |
|---|---|---|---|
| 4,542,471 A | * 9/1985 | Inaba et al. ................... | 700/256 |
| 4,663,009 A | 5/1987 | Bloomquist et al. ...... | 204/192.2 |
| 4,807,153 A | * 2/1989 | Onaga et al. ................ | 700/256 |
| 4,836,733 A | 6/1989 | Hertel et al. ................ | 414/225 |
| 4,864,206 A | * 9/1989 | Onaga et al. .......... | 318/568.11 |
| 4,975,856 A | 12/1990 | Vold et al. ..................... | 395/98 |
| RE34,399 E | 10/1993 | Gami et al. .............. | 360/73.01 |
| 5,537,311 A | * 7/1996 | Stevens ........................ | 700/57 |

FOREIGN PATENT DOCUMENTS

EP         0 688 041        12/1995

* cited by examiner

*Primary Examiner*—Paul P. Gordon
*Assistant Examiner*—Steven R. Garland
(74) *Attorney, Agent, or Firm*—Oblon, Spivak, McClelland, Maier & Neustadt, P.C.

(57) ABSTRACT

A processing system for processing a substrate. The processing system includes a plurality of processing machines, a machine movable along a transfer path for transferring the substrate to the machines, a drive unit for driving the machine, and a control unit. The control unit includes a memory for storing a teaching threshold in a teaching mode and a practical operation threshold in a practical operation mode that is higher than the teaching threshold when a moving parameter of the drive unit exceeds a given value. The control unit also includes a controller monitoring a parameter representing a moving state of the drive unit to stop the drive unit when the parameter exceeds the practical operation threshold in the practical operation mode or when the parameter exceeds the teaching threshold in the teaching mode.

4 Claims, 4 Drawing Sheets

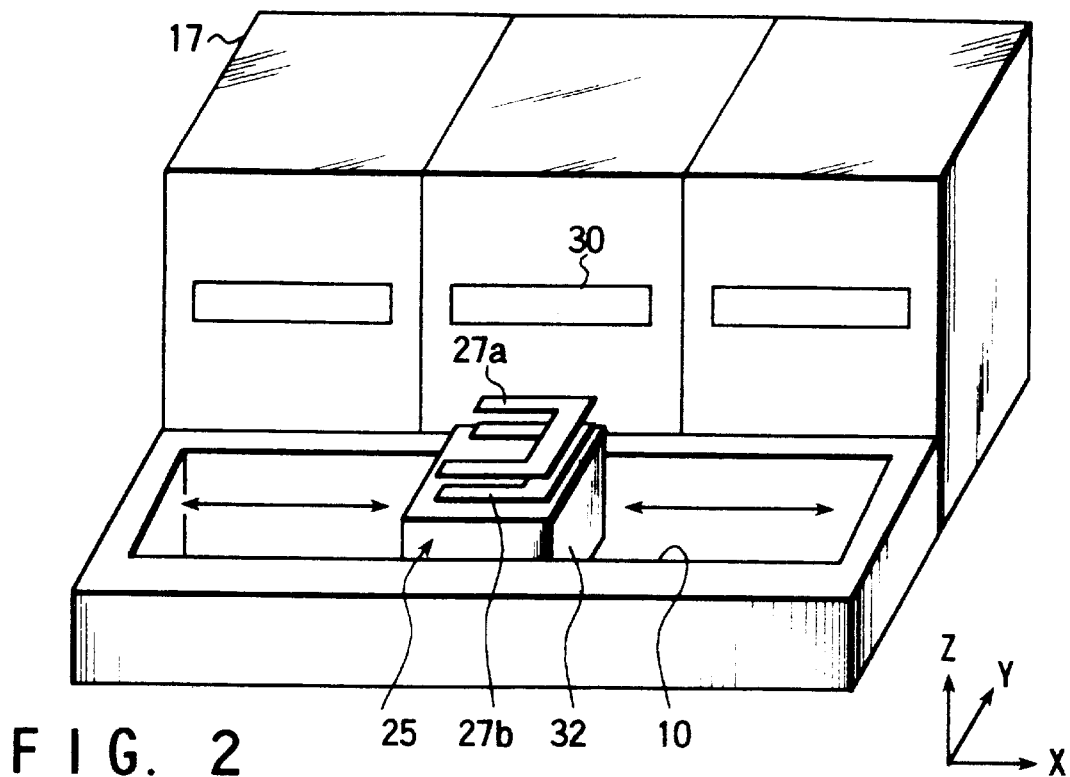
F I G. 2
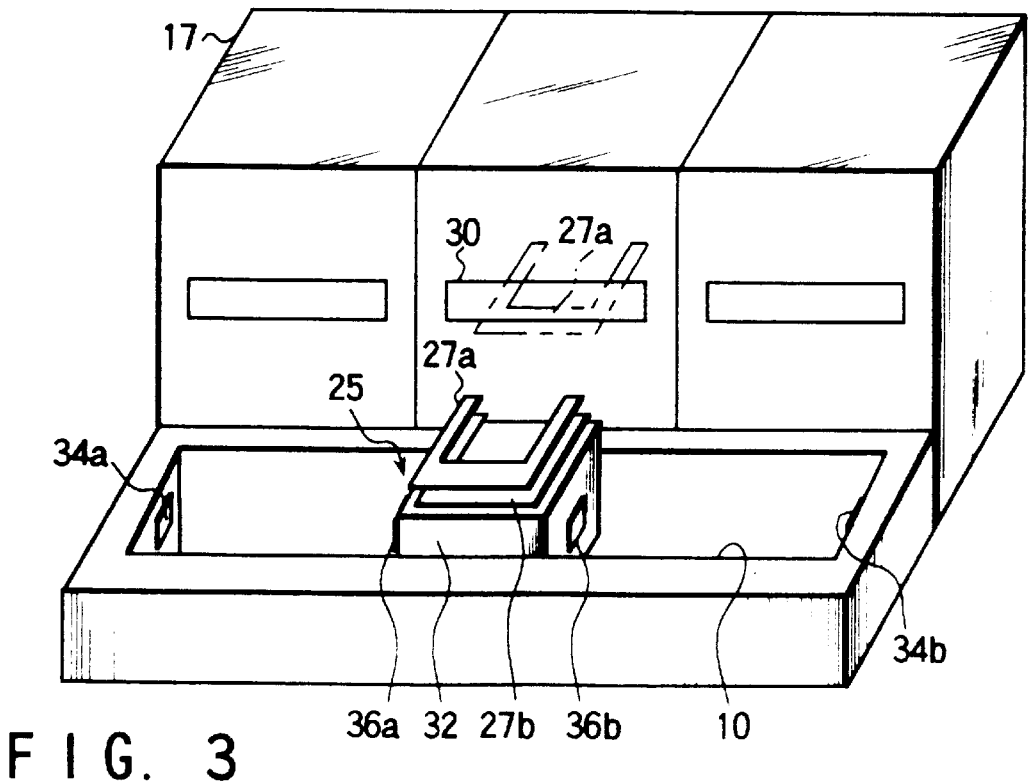
F I G. 3

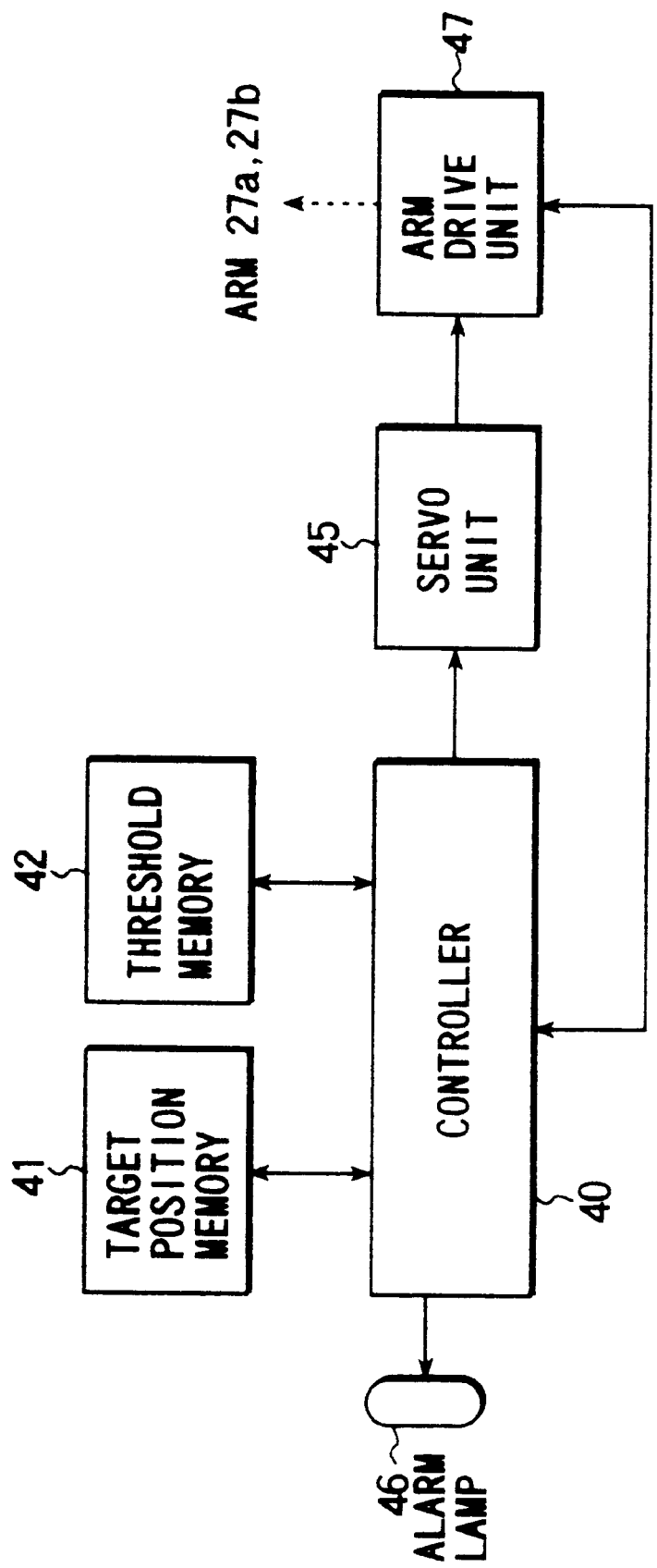
F I G. 4

INTERLOCK APPARATUS FOR A TRANSFER MACHINE

This application is a division of application Ser. No. 08/904,848 Filed on Aug. 1, 1997, now U.S. Pat. No. 5,963,449.

BACKGROUND OF THE INVENTION

The present invention relates to an interlock apparatus of a transfer machine for transferring a substrate such as an LCD substrate (Liquid Crystal Device substrate) or a semiconductor wafer.

In processing the LCD substrate and the semiconductor wafer, a so-called lithographic process is carried out to form a resist pattern on the upper surface of the LCD substrate or the semiconductor wafer. The lithographic process further includes various processing steps such as substrate cleaning, resist coating on the substrate surface, resist exposure, and development.

These steps are performed in a process system in which process machines responsible for these processing steps are collected in one place. In such a process system, a substrate is taken out from a cassette (accommodating a predetermined number of substrates) and transferred one by one between process machines such as a cleaning machine, a resist coating machine, and a developing process machine. The substrate is transferred from a process machine to another process machine by use of a transfer machine provided in the process system. Such a transfer machine has an arm for transferring the substrate to each of process machines, a drive unit for driving the arm, and a control unit for controlling the movement of the control unit. The arm is moved along a transfer path by a moving unit under the control of the control unit. When the arm goes in and out of each of process machines, a substrate is transferred.

The drive unit of the transfer machine mentioned above usually employs a high-torque motor to transfer a large LCD substrate. Therefore, the control unit thereof usually employs an interlock mechanism to ensure the safety operation. The interlock mechanism is used for stopping the movement of the arm in case unusual movement takes place. The interlock mechanism recognizes the movement by quantitative changes in three parameters: movement speed (acceleration) of the arm, deviation of the arm from a predetermined movement position (deviation counter overflow), and power driving the arm (torque limit). The interlock mechanism is designed to stop the movement of the drive unit when any one of the acceleration and deviation counter overflow exceeds its own threshold.

On the other hand, to improve the throughput, the arm of the transfer machine is desirably moved at a speed as high as possible and with a movement power as large as possible. It is also desirable that the transfer machine is continuously operated without stopping the movement even if the movement position of the arm deviates from the predetermined position to some extent (greater than the degree of the teaching time). To attain these, individual thresholds are preferably set at values as large as possible.

In the aforementioned transfer machine, prior to the practical processing of the substrate performed by the process system, so-called teaching is usually performed. The teaching is performed with respect to each process machine to determine the target positions such as a stop position of the arm on a transfer path and an entering position of the arm, and usually performed by an operator while visually monitoring the movement of the arm. More specifically, the arm is manually moved to a predetermined position, followed by storing the position data in the control unit. When the operator performs the teaching, as is often case, he enters the process system. Therefore, the thresholds for the interlock mechanism are desirably set to values as small as possible to ensure the safety of the operator. In other words, if each of the threshold values is set as small as possible, the drive unit can be stopped immediately when any of unusual movements takes place, for example, when the acceleration of the arm exceed the predetermined value, or the deviation counter over flow exceeds a predetermined one, even slightly. Also, when the arm strikes an operator or an obstacle, a large torque is occurred. Therefore, to ensure the operator's safety, it is required to set the threshold values as small as possible.

BRIEF SUMMARY OF THE INVENTION

An object of the present invention is to provide an interlock mechanism for a transfer machine, which is capable of improving a throughput and ensuring a high safety.

The present invention provides a movable interlock apparatus comprising a drive unit for driving a substrate moving machine for moving a substrate; a control unit for controlling the movement of the drive unit; an interlock portion for monitoring a parameter representing the movement condition of the substrate moving machine and stopping the drive unit if the parameter exceed a predetermined value; and a switching circuit for selectively switching the threshold value between a teaching mode (in which the movement position of the transfer machine is controlled) and a practical operation mode (in which the transfer machine is actually operated).

The present invention provides an interlock mechanism for a transfer machine comprising a drive unit for driving an arm for transferring a substrate; and a control unit for controlling the movement of the drive unit, wherein the control unit has a stop function for stopping the movement of the drive unit when a parameter representing an acceleration of the arm member and positional deviation of the arm member exceeds a threshold, a function for inhibiting generation of a undesired torque more than necessary, and a function for switching the threshold value between a normal operation mode and a teaching mode (which is performed for determining the movement position of the arm of the transfer unit).

In the interlock mechanism, each of the threshold acceleration, threshold positional deviation, and threshold movement power is set smaller in the teaching mode than in the normal operation mode of the transfer machine.

In the interlock mechanism of the present invention, each of these threshold values is larger in the normal substrate processing time than in the teaching time. By virtue of the thresholds thus set, even if the acceleration and the movement power of the arm become more or less larger than the teaching time, and the arm deviates from the predetermined position to some extent (larger than the teaching time), the transfer machine is designed to continue the transfer operation without stopping the movement of the drive unit during the normal processing. Therefore, the throughput can be improved.

On the other hand, in the teaching time of the interlock mechanism of the present invention, the threshold values are set smaller than in the normal operation time. By setting like this, if a parameter representing the acceleration and the positional deviation of the arm exceeds the threshold value, even slightly, the driving unit can be stopped to ensure safety operation. Also, when the arm strikes an obstacle and the like, the system generates no undesired torque more than necessary.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a view of a transfer machine for use in explaining the movement thereof;

FIG. 3 is a view of a transfer machine for use in explaining the movement thereof;

FIG. 4 is a block diagram of a control unit for controlling the arm of a transfer machine.

DETAILED DESCRIPTION OF THE INVENTION

Figure 1:
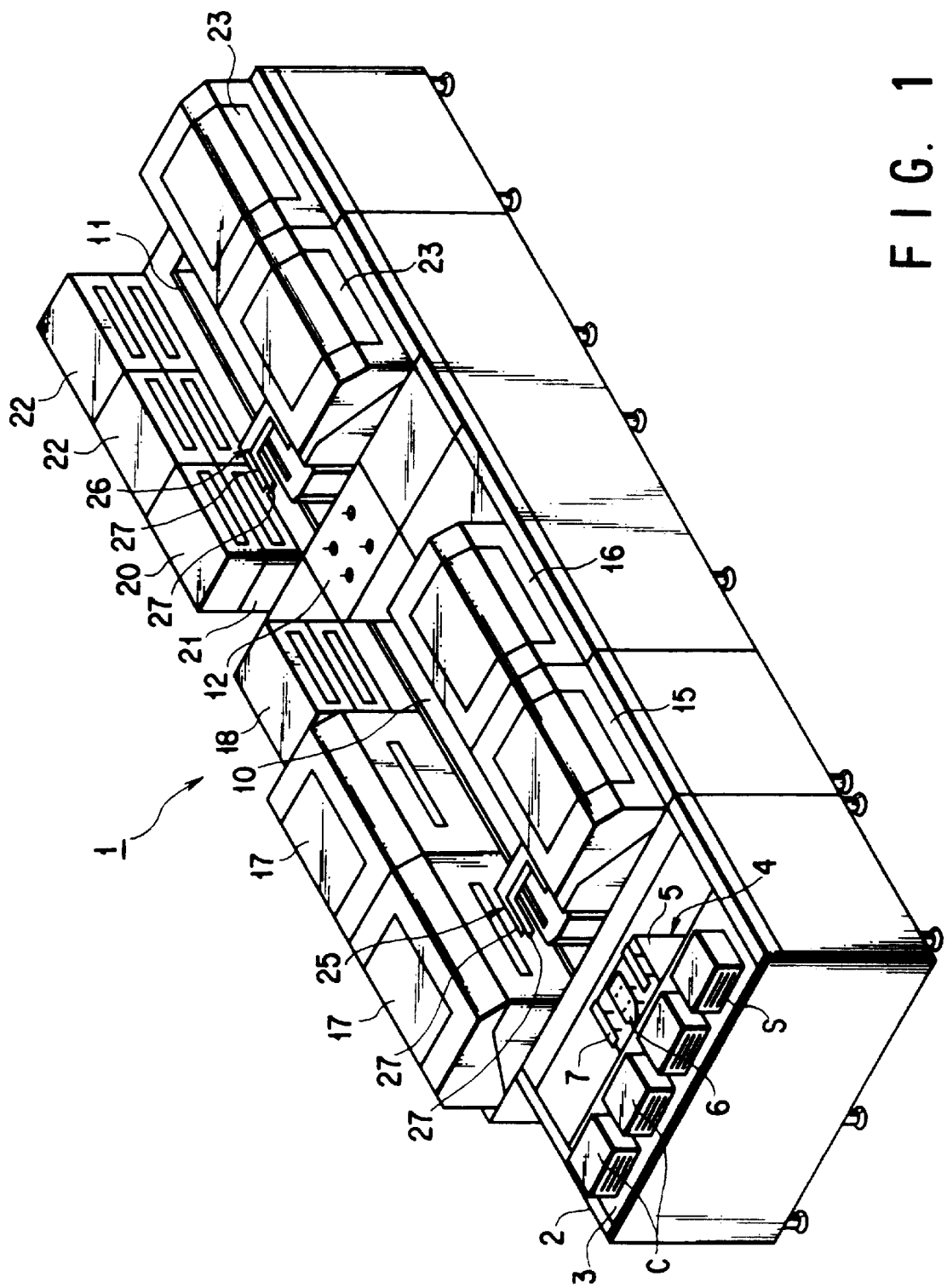
FIG. 1 is a perspective view of a process system having a transfer machine according to the present invention.

According to the process system shown in FIG. 1, a loader/unloader unit 2 (cassette station) is provided in the anterior portion of a process system 1. The loader/unloader unit 2 has a function of loading and unloading a substrate S such as an LCD substrate to the process system 1. In the loader/unloader portion 2, a cassette table 3 and a loader/unloader 4 are provided. On the cassette table 3, cassettes C (e.g., 25 substrates S are accommodated for each) are arranged in line at the predetermined position. The loader/unloader 4 unloads a substrate S to be processed from each of the cassettes C and loads a processed substrate S to each of cassettes C. The loader/unloader 4 shown in the figure moves along with the movement of a carriage 5 in the arrangement direction of cassettes C. A substrate S is unloaded from and loaded to each of cassettes C by means of a pair of tweezers 6 provided onto the carriage 5. On both sides of the tweezers 6, a wafer alignment member 7 is provided for effecting alignment by holding four corners of the substrate S.

In the center portion of the system 1, transfer paths 10 and 11 are provided in line like a corridor. Between the transfer path 10 and 11, a substrate passing section 12 is interposed. In both sides of the transfer paths 10 and 11, various process machines are arranged for use in processing the substrate S.

On one side of the transfer path 10 of the process system 1 shown in the figure, juxtaposed are a brush scriber 15 for brushing up the substrate S and a high pressure jet cleaner 16 for washing the substrate with high pressure jet water. On the other side of the transfer path 10, two development process machines 17 are placed side by side. Next to one of the development process machines 17, two heaters 18 are provided in a layered fashion.

On one side of the transfer path 11, an adhesion machine 20 is provided for eliminating water from the substrate S before coating a resist film on the substrate S. Under the adhesion machine 20, a cooler 21 is provided for cooling the substrate. Adjacent to the construct consisting of the adhesion machine 20 and the cooler 21, two double-layered heaters 22 (each having two discrete heaters piled up) are positioned next to each other. On the other side of the transfer path 11, two resist coating machines 23 are positioned side by side which are used to form a resist film, i.e., a photosensitive film, on the surface of the substrate S by coating a resist solution thereon. On a side portion of the resist coating machines 23, an optical stepper or the like (not shown) is provided for exposing the resist film (formed on the substrate S) to light to make a predetermined micropattern on the resist film.

In the various process machines 15–18 and 20–23 arranged on both sides of transfer paths 10 and 11, substrate ports are provided so as to face inwards. A first transfer machine 25 moves on the transfer path 10 to transfer the substrate S to the loader/unloader portion 2, to each of the process machines 15–18, and to the substrate passing section 12, and vice versa. A second transfer machine 26 moves on the transfer path 11 to transfer the substrate S to the substrate passing section 12 and to each of the process machines 20–23 visa versa. Each of the transfer machines 25 and 26 has a pair of arms 27a and 27 ba and 27b consisting of an upper arm and a lower arm. When the arms accesses to each of process machines 15 to 18 and 20 to 23, one of the arms 27a and 27b unloads processed substrate S from a chamber of each process machine and the other arm loads a new substrate S in the chamber.

As an example for the case where a substrate S is loaded in and unloaded from the process machine by the first transfer machine 25, we will now take the development machine 17. As shown in FIG. 2, on the side face of the development process machine 17 facing the transfer path 10, a port 30 for a substrate S is provided. A carriage 32 of the transfer machine 25 is designed to move along the transfer path 10 in the longitudinal direction (the X direction in FIG. 2). On the upper surface of the carriage 32, a pair of arms (upper arm 27a, lower arm 27b) explained above are provided. These arms 27aand 27ba and 27b are moved by a drive unit (not shown) housed in the carriage 32 in the longitudinal direction of the system 1 (direction X in FIG. 2), in the direction perpendicular to the X direction (direction Y in FIG. 2) of the system 1, and in the vertical direction (direction Z of FIG. 2), separately. In addition, the arms can be rotated about the Z direction.

As shown in FIG. 3, the carriage 32 is moved along the transfer path 10 and then stopped in front of the development process machine 17. The arms 27a and 27b are rotated by the driving unit (not shown) about the Z direction and moved up and down in the Z direction. In this manner, the distal ends of the arms 27a and 27b are adjusted so as to face the port 30 of the development process machine 17. Subsequently, the upper arm 27a, for example, is inserted in the development machine 17 from the port 30, thereby unloading a developed substrate S from the development machine 17. Thereafter, using the lower arm 27b, a new substrate S not yet treated is loaded in the development process machine 17. In this manner, the substrate S is loaded in and unload from the development process machine 17.

For the purpose of detecting the entry of a person to transfer path 10, an intrusion detector is provided in the transfer path 10. The intrusion detector comprises two optical sensors 34a and 34b arranged on opposite walls of the transfer path 10, respectively, and two reflectors 36a and 36b disposed on side walls of the carriage 32, respectively, so as to face the optical sensors 34a and 3b.

In the above intrusion detector, when, for example, the hand of the operator is inserted in the transfer path 10, the light between the optical sensor 34a or 34b and the reflector 36a or 36b is blocked by the hand, so that the intrusion detector detects the entry of a person to the transfer path. This ensures a safety for the person.

In the foregoing, we have explained the manner how to load and unload the substrate S by the first transfer machine 25, taking the development process machine 17 as an example. This is also the case with other process machines such as the brush scriber 15, high pressure jet cleaner 16, heater 18, and loader/unloader 4. In the same manner, the second transfer machine 26 is responsible for the load/unload of the substrate S with respect to the adhesion machine 20, cooler 21, heater 22, and resist coating machines 23. Furthermore, the substrate S is transferred from the first transfer machine to a second transfer machine 26, and vice versa, by way of the passing portion 12.

FIG. 4 shows a schematic block diagram of a control unit for controlling the arms 27a and 27b of the transfer machines 25 and 26. A controller 40 comprises a target position memory 41 and a threshold memory 42. The target position memory 41 stores data for the movement positions of the arms 27a and 27b of the transfer machines 25 and 26, which are determined by the teaching described later. The threshold memory 42 stores threshold values A, B and C and threshold values a, b and c.

Threshold values A, B and C are used in normal operation time for the transfer machines 25 and 26. Details of the threshold values are as follows:

A: threshold movement speed of the arms 27a and 27b during the normal operation, B: threshold deviation of the arms 27a and 27b from a predetermined position during the normal operation, C: threshold movement power of the arms 27a and 27b during the normal operation.

On the other hand, the threshold values a, b, and c are set for the teaching operation for determining movement position of the arms 27a and 27b of the transfer machines 25 and 26. Details of the threshold values are as follows:

a: threshold movement speed of the arms 27a and 27b during the teaching operation, b: threshold deviation of the arms 27a and 27b from a predetermined position during the teaching operation, c: threshold movement power of the arms 27a and 27b during the teaching operation.

The threshold values A, B, and C are set larger than the threshold values a, b, and c, respectively. That is, A>a, B>b, C>c. During the teaching operation for determining the movement position of the arms 27a and 27b, the threshold values a, b, and c are read into the controller 40, as described later. On the other hand, the threshold values A, B, and C are read into the controller 40 during the normal operation.

The drive unit 47 for driving the arms 27a and 27b is driven by supplying a predetermined power to a servo unit 45 in accordance with the instructions from the controller 40. The drive unit 47 operates the arms 27a and 27b appropriately to perform load/unload of the substrate S and to transfer the substrate S between process machines 15 to 18, 20 to 23, and loader/unloader 4.

The data of the moving speed, positional deviation, and movement power of the arms 27a and 27b are converted into electric signals corresponding to the rotation number or torque of a servo motor of the servo portion 45. All the electric signals are fed back to the controller 40. During the teaching operation, the movement of the drive unit for the arms 27a and 27b is designed to stop if at least one of the values thus fed back exceeds the corresponding threshold values a, b, and c, as will be described later. During the normal operation of the transfer machines 25 and 26, the movement of the drive unit for the arms 27a and 27b is stopped if at least one of the values thus fed back exceeds the corresponding threshold values A, B, and C. When the movement of the drive unit is stopped in this manner, an alarm lamp 46 is turned on.

In the case where lithographic treatment of the substrate S is made in the process system 1, at first, the teaching operation is performed to determine the movement position of the arms 27a and 27b of the transfer machine 25 and 26. During the teaching time, the control machine 40 reads the smaller threshold values a, b, and c from the threshold memory 42. Then, an operator moves the arms 27a and 27b, while monitoring it visually, to the position at which the substrate S should be transferred. The data of the arm movement position are stored in the target position memory 41.

When the teaching is performed, as is often case, the operator enters the process system 1. Since the threshold values to be read into the control machine 40, have been switched to the smaller threshold values a, b, and c, the movement of the arms 27a and 27b is stopped immediately when any one of the parameters the movement speed, the positional deviation, and movement power of the arms 27a and 27b, exceeds a predetermined value even slightly. In this manner, safety of teaching operation can be ensured.

After completion of the teaching, the lithography process is started in the process system 1. When the transfer machines 25 and 26 are switched to such a normal operation time, larger threshold values A, B and C are read into the control machine 40 from the threshold memory 42.

At first, a substrate S is unloaded by means of the loader/unloader 4 from the cassette C mounted on the loader/unloader portion 2, as shown in FIG. 1. Subsequently, the substrate S thus unloaded is transferred to the arm 27 of the transfer machine 25. The substrate S thus transferred to the arm 27 is then loaded into the brush scriber 15 to wash the substrate S with a brush. Depending on processes, the substrate S may be washed with high-pressure jet water in the high-pressure jet washing machine 16. The substrate S thus washed is transferred by the arms 27a and 27b and loaded in the heater 18 for heat and dry.

After completion of drying, the substrate S is subjected to the adhesion treatment in the adhesion machine 20. After the substrate S is cooled in the cooler 21, resist is coated on the surface of the substrate S in the resist coating machine 23. Then, the substrate S is heated by the heater 22 and exposed to light in an exposure machine (not shown), thereby irradiating the resist film. The substrate S is subsequently loaded in the development machine 17 to develop it. After the development, the substrate S is unloaded from the development machine 17 by use of the arms 27a and 27b, and then subjected to heat and dry in the heater 18. Finally, the substrate S is housed in the cassette C mounted on the loader/unloader portion 2.

In the normal operation time of the transfer machines 25 and 26, the threshold values to be read into the control machine 40 are switched to the larger threshold values A, B, and C. Hence, the transfer operation can be continued without stopping the movement of the drive unit, even if any one of parameters including the movement speed, the movement power, and positional deviation exceed a predetermined position to some extent (greater than the degree of the teaching time). Hence, the throughput can be improved.

Hereinbelow, the interlock mechanism of the entire process system shown in FIG. 1 will be explained with reference to FIG. 5.

Figure 5:
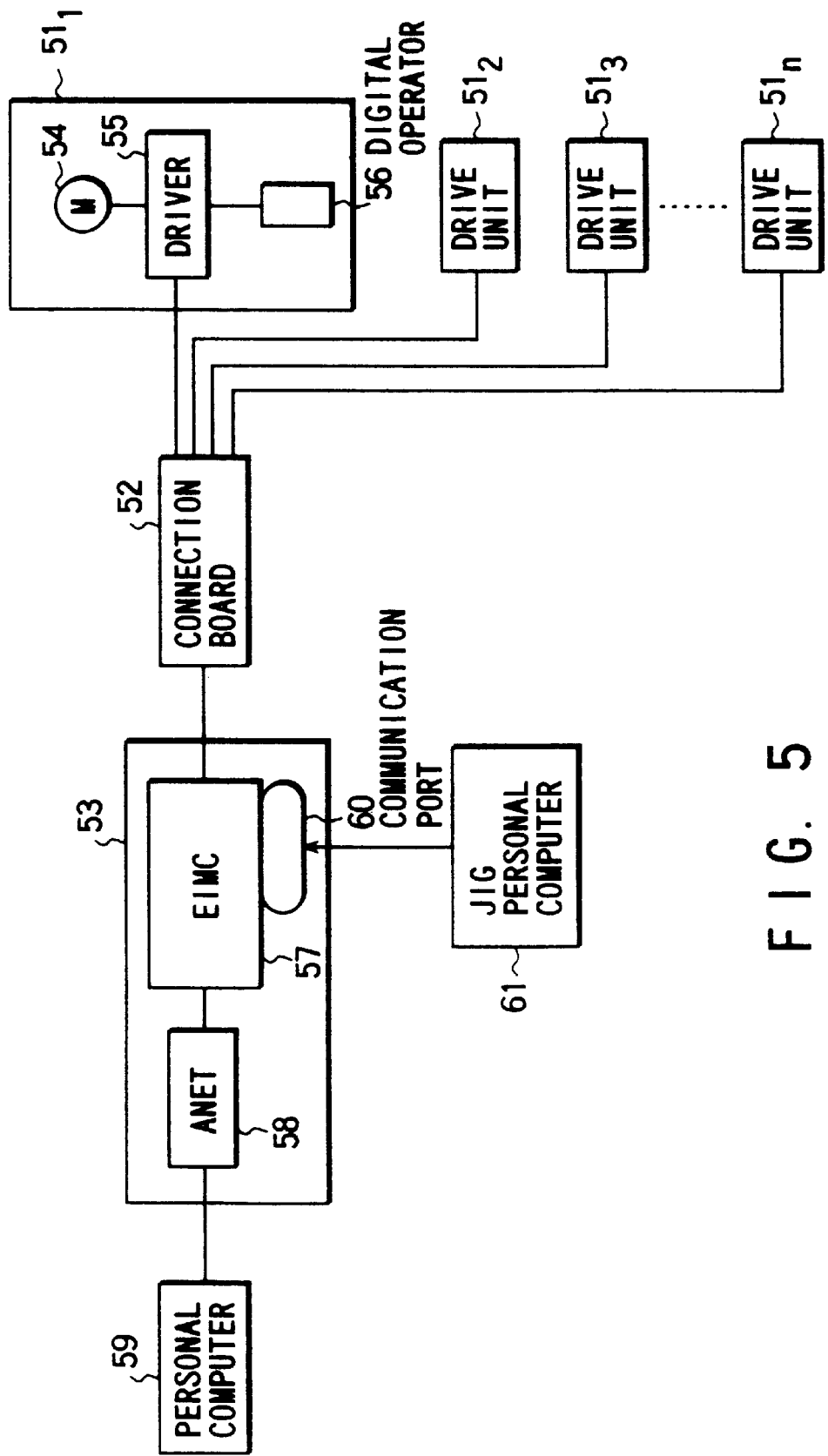
FIG. 5 is a schematic block diagram of a process system having an interlock function according to an embodiment of the present invention.

According to FIG. 5, drive units $51_1$ to $51_n$ for driving process machines of the process system are connected to a block controller 53 by way of a connection board 52. Each of drive units $51_1$ to $51_n$ comprises a servo motor 54 for driving the arm of the transfer machine, a driver 55 for controlling the servo motor, and a digital operator 56 serving as an input unit. The block controller 53 comprises a control board (EIMC) for controlling the servo motor and a communication board (ANET) 58. The communication board 58 is connected to a personal computer 59. The personal computer 59 stores position data required for moving the servo motor. These position data are output to the communication board 58 during the operation time. The personal computer 59 also stores recipe data necessary for controlling the entire process system and other process system. Therefore, the personal computer 59 is a so-called user computer for controlling the process system of a factory in its entirety.

To the control board 57, a communication port 60 is provided. To the communication port 60, a jig personal computer 61 is connected. The jig personal computer 61 stores a software for regulating the transfer system.

When the teaching is carried out in the process system shown in FIG. 5, regulation parameters such as a torque limit and an acceleration limit are set in the driver 55 by the digital operator 56. The teaching software is set in the control board 57 by the jig personal computer 61.

When the teaching is initiated under the aforementioned conditions, the control board 57 transmits an instruction pulse, a servo-on signal and a parameter-change signal to the drive unit of the process machine, for example, a drive unit $51_1$, via the connection board 52. The servo signal is sent to set the driver 55 into servo conditions. The instruction pulse is sent to drive the servo motor 54. The parameter-change signal switches the operation mode from the teaching mode to the normal production mode, and vice versa.

When the parameter-change signal is turned off, the process system is switched to the teaching mode. Then, the torque and acceleration values for the driver 55 are set to 20 to 30% of the rated values. In other words, the output power of the serve motor is limited to 20 to 30% of the rated output power. When the parameter-change signal is turned on, the process is switched to the normal production mode. Hence, the parameters of the driver 55 are set to the rated values in order to output 100% power.

When the driver is set at the teaching mode by the parameter-change signal, the teaching mode signal is sent to the control board 57. When the control board 57 receives the teaching mode signal, it sends the servo-on signal and the instruction pulse to the driver 55. When the driver receives the servo-on signal, the driver 55 drives the servo motor 54 in accordance with the instruction pulse. At this time, the servo motor 54 is driven with a torque limit of 20–30% of the rated values. The driver 55 monitors the-rotation conditions of the servo motor 54 by counting the instruction pulse by means of a deviation counter. To explain more specifically, the value of the deviation counter is maintained at a constant value when the servo motor 54 is rotated normally in accordance with the instruction pulse. However, when the servo motor 54 is stopped the rotation by some causes, for example, in the case where the arms hit an object or the like, the deviation counter is continuously incremented, causing an overflow since the instruction pulse is continuously sent and therefore counted by the deviation counter even the motor is stopped. The overflow signal is then sent to the control board 57 and the control board 57 transmits an alarm signal to stop the movement of the driver 55. To be more specific, the control board 57 stops output of the instruction pulse, with the result that the transmission of a drive pulse to the servo motor 54 is stopped. The servo signal is then turned off, thereby turning off the servo motor 54.

As described above, in the teaching mode, the driver 55 has an interlock mechanism which limits the moving speed and torque within certain values and stops the movement upon striking objects.

After the adjustment of the process machine is properly made in the teaching process, the data of threshold movement speed A, threshold positional deviation value B, and threshold movement power C of the arm for the normal operation time are then copied in the personal computer 59 to initiate the normal operation.

To explain more specifically, to start the normal operation, the personal computer 59 sends "on" parameter-change signal to the control board 57 by way of the communication board 58. When the control board 57 is switched to the normal production mode in this manner, the instruction pulse and threshold values A, B, and C for the normal operation are sent to the control board 57. The control board 57 controls the process in accordance with data signal from the personal computer 59 which are transmitted from the drive units $51_1$ to $51_n$ via the connection board 52. In this way, the process machine is operated in the production mode.

The above embodiment applies the present invention to a transfer machine, but the present invention may be applied to a spin chuck on which a substrate is put on and which rotates the substrate to coat, for example, resist on the substrate. In this case, when the spin chuck is obstructed its rotation, the safety function becomes active. In other words, when the spin chuck is stopped accidentally by the operator and the counter overflows, the safety function for switching a threshold, for example, acts in the same manner as the transfer machine.

In the interlock apparatus for the transfer machine according to the present invention, the threshold values for stopping the movement of the arm are switched from the normal operation time to the teaching time and vice versa, thereby improving the throughput during the normal operation time and ensuring the safety at the teaching time.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing system for processing a substrate comprising:
   a plurality of processing machines for subjecting various processings to the substrate;
   a transfer machine movable along a transfer path for transferring the substrate to the processing machines;
   a drive unit for driving the transfer machine; and
   a control unit including a memory for storing a teaching threshold in a teaching mode and a practical operation threshold in a practical operation mode that is higher than the teaching threshold, and a controller monitoring a parameter representing a moving state of the drive unit to stop the drive unit when the parameter exceeds the practical operation threshold while operating in the practical operation mode and when the parameter exceeds the teaching threshold while operating in the teaching mode, wherein said drive unit includes a servo motor for driving the transfer machine, and said control unit includes means for generating an instruction pulse for driving the servo motor, a servo signal for turning the servo motor on or off, and a parameter-change signal for switching parameters from the teaching mode to the practical operation mode, and vice versa, wherein the drive unit is switched to the teaching mode when the parameter-change signal is turned off, and wherein the control unit sets a torque value and an acceleration value of the servo motor in the teaching mode to a value lower than a rated torque value of the practical operation mode.

2. The processing system according to claim 1, wherein the drive unit has a counter for counting the instruction pulse to output a count, the control unit monitors the count of the drive unit and stops the drive unit when the count exceeds a predetermined value.

3. A processing system for processing a substrate comprising:

a plurality of processing machines for subjecting various processings to the substrate;

a transfer machine movable along a transfer path for transferring the substrate to the processing machines;

a drive unit for driving the transfer machine; and a control unit for controlling the drive unit in accordance with a teaching mode for performing a teaching operation of the drive unit and a practical operation mode for controlling an actual operation thereof, the control unit including means for stopping the operation of the drive unit when a movement parameter of the drive unit exceed a predetermined value and means for setting the predetermined value smaller in the teaching mode than in the practical operation mode, wherein said drive unit includes a servo motor for driving the transfer machine, and said control unit includes means for generating an instruction pulse for driving the servo motor, a servo signal for turning the servo motor on or off, and a parameter-change signal for switching parameters from the teaching mode to the practical operation mode, and vice versa, wherein the drive unit is switched to the teaching mode when the parameter-change signal is turned off, and wherein the control unit sets a torque value and an acceleration value of the servo motor in the teaching mode to a value lower than a rated torque value of the practical operation mode.

4. The processing system according to claim 3, wherein the drive unit has a counter for counting the instruction pulse to output a count, the control unit monitors the count of the drive unit and stops the drive unit when the count exceeds a predetermined value.

\* \* \* \* \*